(12) United States Patent
Freund et al.

(10) Patent No.: US 6,263,555 B1
(45) Date of Patent: Jul. 24, 2001

(54) METHOD AND APPARATUS FOR HANDLING LASER BAR

(75) Inventors: Joseph Michael Freund, Fogelsville; George John Przybylek, Douglasville; Dennis Mark Romero, Allentown; Mindaugas Fernand Dautartas, Alburtis, all of PA (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/617,245

(22) Filed: Jul. 14, 2000

Related U.S. Application Data

(63) Continuation of application No. 09/225,269, filed on Jan. 5, 1999, now Pat. No. 6,125,530.

(51) Int. Cl.[7] .................................................. B23P 19/00
(52) U.S. Cl. ........................... 29/426.5; 118/503; 29/700; 29/239; 29/764; 29/270
(58) Field of Search .................................. 29/426.5, 700, 29/239, 764, 270; 15/230.11, 100, 98, 144.1, 144.4; 118/DIG. 15, 500, 213, 503

(56) References Cited

U.S. PATENT DOCUMENTS

| | | |
|---|---|---|
| 2,305,011 | 12/1942 | Kienninger . |
| 2,321,511 | 6/1943 | Piercy . |
| 2,794,202 | 6/1957 | Schueler . |
| 3,506,996 | 4/1970 | Brennan . |
| 3,910,738 | 10/1975 | Chandler et al. . |
| 4,195,758 | 4/1980 | Morgan . |
| 4,875,246 | 10/1989 | MacGregor . |
| 4,995,539 | 2/1991 | Richard . |
| 5,069,732 | * 12/1991 | Levine . |
| 5,536,314 | 7/1996 | Rannestad . |
| 5,618,133 | 4/1997 | Mitsui et al. . |
| 5,657,503 | 8/1997 | Caruso . |
| 5,713,095 | 2/1998 | Wakat . |
| 5,904,094 | 5/1999 | Bredenberg . |
| 5,911,830 | 6/1999 | Chakrabarti et al. . |

FOREIGN PATENT DOCUMENTS

0806494 A1 * 12/1997 (EP) .

* cited by examiner

Primary Examiner—P. W. Echols
Assistant Examiner—Steve Blount
(74) Attorney, Agent, or Firm—Dicksstein Shapiro Morin & Oshinsky LLP

(57) ABSTRACT

A method and apparatus are provided for freeing laser bars stuck in a facet coating fixture. A roller device is provided that rolls into a facet coating fixture channel and applies a downward force to a stuck laser bar. The roller device provides an uncomplicated and reliable system for handling the bars.

4 Claims, 3 Drawing Sheets

METHOD AND APPARATUS FOR HANDLING LASER BAR

This application is a divisional of application Ser. No. 09/225,269, filed Jan. 5, 1999, now U.S. Pat. No. 6,125,530, which is hereby incorporated by reference.

FIELD OF THE INVENTION

The present invention relates to a method and apparatus for handling a laser bar or laser bars and relates to a system for loosening a bar or bars stuck in a channel of a facet coating fixture.

BACKGROUND OF THE INVENTION

Laser diodes are manufactured from laser bars that are in turn manufactured from substrates. A laser bar, also referred to as a bar of diodes, is formed by cleaving a section from a semiconductor substrate. The substrate has a number of contiguous diodes in a pattern. The laser bars are facet coated prior to separating into individual laser diodes.

Laser bars are coated by placing the bar on its edge in a coating fixture such as that disclosed in copending U.S. patent application Ser. No. 08/844,455, the contents of which are incorporated herein by reference. Various coatings may be applied to the bar's facets that effect the operation of the individual laser diodes. Regardless of the type of coating used, the laser bars can get stuck in the facet coating fixture. When this happens the laser bars must be loosened to be removed.

A facet coating fixture is comprised of multiple channels each of which hold individual bars. When the coating process is finished, the holding mechanism retracts and the bars are meant to fall through exit channels, with the assistance of a vacuum or other means. Even under these conditions the bars do not always release and some stick to one side or the other of the channel. The bars are fragile. Since the ends of a bar have no devices, the ends are the only places it can be safely handled without damaging it.

Prior art systems have failed to provide an efficient method for freeing stuck laser bars in a reliable manner.

SUMMARY OF THE INVENTION

The present invention solves these and other problems by providing a method and apparatus for loosening laser bars from a facet coating fixture and other devices containing channels. The present invention is directed to the loosening of any form of laser bar that is stuck in a channel of a coating fixture.

The laser bars have two ends. The ends contain alignment marks for processing. There are no devices on the ends. Consequently, the ends can be handled without damaging the laser bar. The ends are approximately twenty (20) mils wide and can be touched. The present invention takes advantage of this fact by using a two part roller device to apply pressure to the end areas. The pressure is applied to both ends of the bar so that the bar is released without causing breakage.

The roller device can be guided by grooves that already exist on the coating fixture. The roller device can be readily positioned in the grooves and traversed up and down the length of the coating fixture, from channel to channel, releasing all stuck bars in a single action. The roller may be used with or without an alignment fixture.

The roller device must have a diameter that is larger than the lateral width of the channel. This permits the roller device to roll into the channel and back out. The diameter of the roller device, relative to the channel width, permits the roller device to penetrate inside the channel a sufficient distance to contact the stuck bar. In addition, the diameter of the roller device is sufficiently large such that the majority of the downward movement that the roller device is capable of achieving is concentrated on the outside edge, the non-sticking side, of the bar.

In an alternate embodiment, the roller device can be integrated with a spring or actuator assembly so that the force can be adjusted or fixed.

With these and other objects, advantages and features of the invention that may become apparent, the nature of the invention may be more clearly understood by reference to the following detailed description of the invention, the appended claims, and to the several drawings attached herein.

DETAILED DESCRIPTION OF PREFERRED EMBODIMENTS

Figure 1:
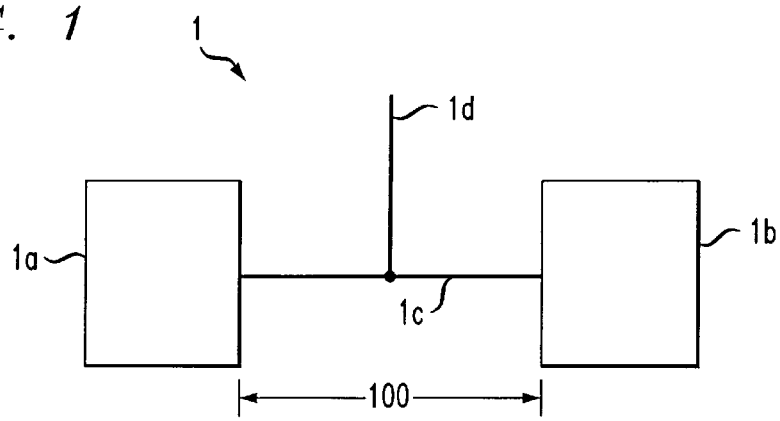
FIG. 1 is a front view of a roller device constructed in accordance with a preferred embodiment of the present invention.
Figure 2:
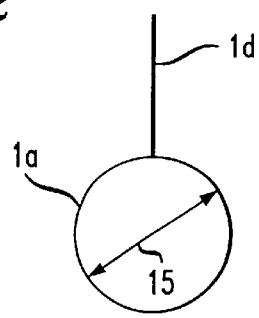
FIG. 2 is a side view of the roller device of FIG. 1.

FIGS. 1 and 2 show a roller device 1 which has two rollers 1a, 1b. The two rollers 1a, 1b are maintained in axial alignment through the use of a holder, shown schematically as 1c. The holder 1c is operated through the use of a handle means, schematically shown as 1c. The rollers 1a, 1b are cylindrical.

Figure 3:
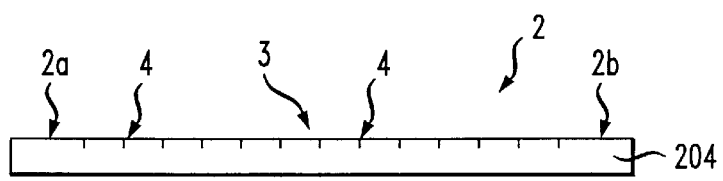
FIG. 3 is a side view of a laser bar.
Figure 4:
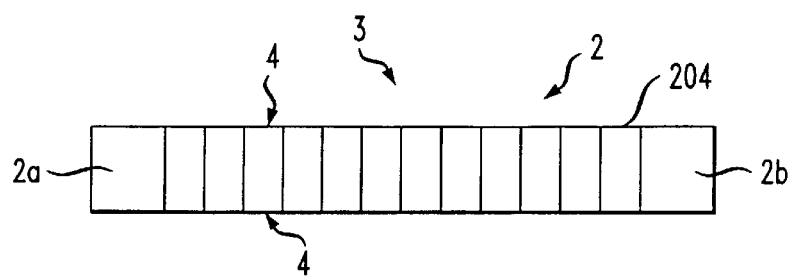
FIG. 4 is a top view of the laser bar of FIG. 3.

FIGS. 3 and 4 show a laser bar 2 in cross-section and top view respectively. The laser bar 2 has a rectangular substrate that is notched to form devices defined between the marks 4. FIG. 3, the cross-section, shows the facet 204 of the laser bar. The end sections 2a and 2b are contacted by roller release device. For illustrative purposes, the marks 4 show the repeated patterns that define the individual laser diodes, prior to separation. The center portion 3 should not be handled. The ends 2a, 2b of the laser bar 2 are free of devices. The end sections 2a, 2b can be handled without damaging the laser diodes in the center section 3.

Figure 5:
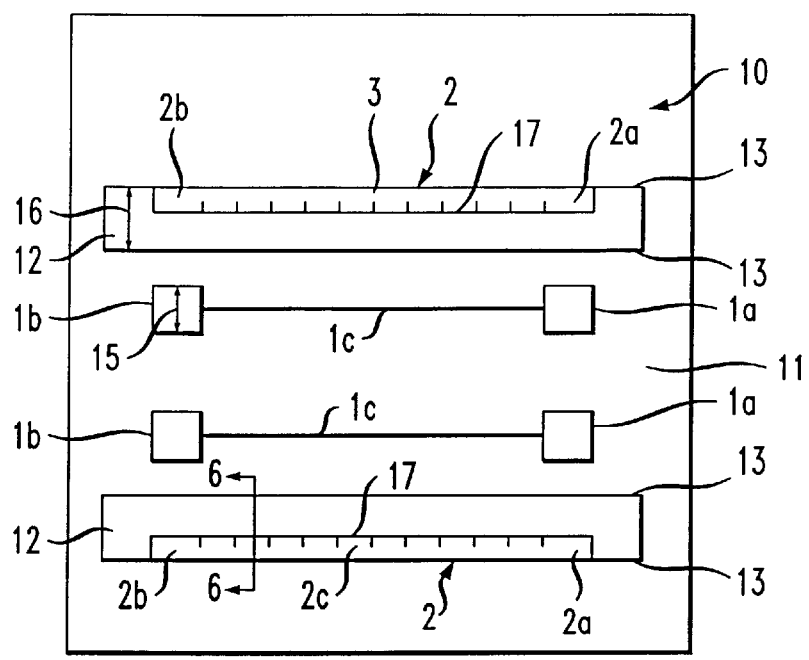
FIG. 5 is a top view of a facet coating fixture, with two stuck laser bars, constructed in accordance with a preferred embodiment of the present invention.

Referring now to FIG. 5, a facet coating fixture 10 is shown with two laser bars 2 stuck in channels 12. Two roller devices 1 are provided. There is one roller device 1 for each channel 12. The following discussion refers to only a single roller device 1 and a single stuck bar 2. The application of the other roller devices 1 may be the same. In an alternative embodiment of the invention, a single roller device 1 may be used to release both laser bars 2. That is a single facet coating fixture 10 may have one roller device 1 for all channels 12 or one roller device 1 for each channel 12. The laser bars 2 may be about four mils wide.

The roller device 1 is designed to come into contact with the two ends of the laser bar 2a, 2b. The distance 100 (FIG. 1) between the rollers 1a, 1b depend on the length of the laser bar center portion 3 (that is, the distance between the bar ends 2a, 2b). The diameter 15 of the circular roller ends 1a, 1b must be greater than the width 16 of the channel 12. In a preferred embodiment, the roller diameter 15 is one hundred and sixty percent (160%) of the channel's width 16.

Figure 6:
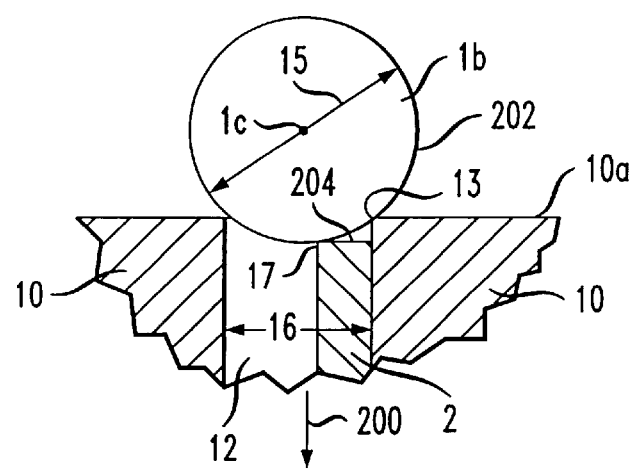
FIG. 6 is a partial cross sectional view of the facet coating fixture of FIG. 5, taken along the line 6—6, with a roller device in a channel.

The roller device 1 is designed to roll on the top surface 10a of the facet coating fixture 10, as shown in FIGS. 5 and 6. The facet coating fixture 10 is more fully described in U.S. patent application Ser. No. 08/844,455 the contents of which are incorporated herein by reference.

The facet coating fixture 10 is used to coat the laser bars 2. The laser bars 2 are placed in channels 12 and held in place during the coating process. After the coating process is finished, the laser bars 2 are released and are removed in the direction represented by arrow 200 in FIG. 6, and through a removal channel by a vacuum (not shown). The laser bars 2 however can get stuck in the channels 12.

The roller device 1 is designed to roll into the channels 12 to remove the stuck laser bars 2. The roller device 1 exerts a force on the ends 2a, 2b to effectuate the removal of a stuck laser bar 2. The roller device 1 pivots on edge 13 and partially penetrates into the channel 12. The diameter 15 of the roller 1 is greater than the width 16 of the channel 12.

As the diameter 15 of the roller device 1 is larger than the width 16 of the channel 12, the roller device 1 penetrates the farthest in the center of the channel 12. Thus, the laser bar 2 is pushed downward to the greatest extent possible on its non-stuck edge 17. The roller device 1 can be rolled into the channel 12 from either side so as to free or loosen a laser bar 2 that is stuck to either side of the channel 12. As such, the roller device 1 may contact the non-stuck edge 17 at the beginning of the removal process or at the end of the removal process.

In addition, the cylindrical surfaces 202 of the roller device 1 permit the pressure to be applied across the top surface 204 of the stuck bar 2. Other shapes may be used for the rollers 1a, 1b that accomplish approximately the desired application of force.

Figure 7:
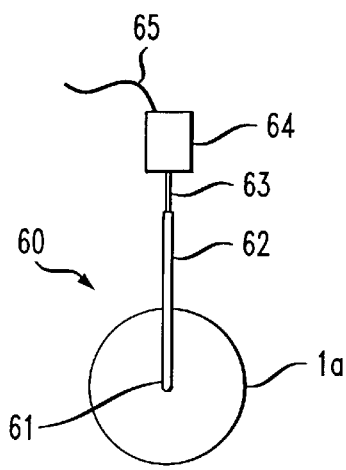
FIG. 7 illustrates an adjustable force device constructed in accordance with the invention.

FIG. 7 shows a profile of a variable force roller 60. A roller 1a is attached to an arm 62 through a connection means 61. The arm 62 is connected to an actuator arm 63 that is in turn connected to an actuator 64. The actuator 64 is connected to a control device (not shown) that can control the downward force of the roller 1a.

Figure 8:
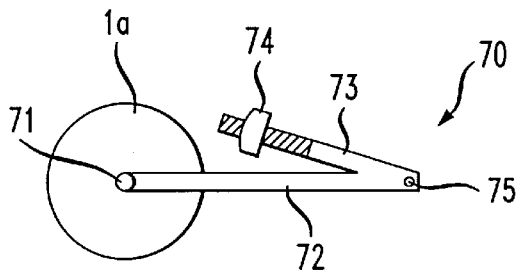
FIG. 8 illustrates another force device constructed in accordance with the invention.

FIG. 8 shows a profile of another variable force roller device 70. A roller 1a is connected to a first arm 72 through a connection means 71. The first arm 72 is connected to a weight arm 73. The weight arm 73 is connected to the first arm 72 at an angle, such that a weight 74 placed on the end of the weight arm 73, changes the downward force of the roller 1a a predetermined amount. The weight arm 73 and first arm 72 comprise a connection point 75 that is used to pull or push the roller 1a across the facet coating fixture 10.

Figure 9:
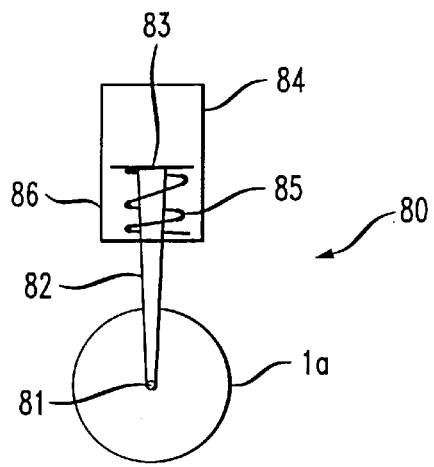
FIG. 9 illustrates another force device constructed in accordance with the invention.

FIG. 9 shows a profile of a variable force roller device 80. A roller 1a is connected to an arm 82 through a connector means 81. The arm 82 is provided with a top plate 83. A container 84 is provided that permits vertical movement of the top plate 83. A spring 85 is provided in the container 84 between a bottom 86 and the top plate 83. The spring 85 assists in reducing the force applied by the roller 1a. Alternately, the spring 85 may be positioned to increase the force applied by the roller 1a.

The invention herein described and claimed may be modified and is not limited to the specific embodiments herein described.

What is claimed:

1. A laser bar loosening system comprising:
a facet coating fixture comprising at least one laser bar coating channel; and
a roller device mounted relative to said channel to permit said roller device to roll into said at least one channel for removing a stuck laser bar.

2. The laser bar loosening system as claimed in claim 1 further comprising a controller for controlling movement of said roller device and monitoring said movement.

3. A method for removing a laser bar from a facet coating fixture, said method comprising the steps of:
applying a first force only to a first end of said laser bar;
applying a second force only to a second end of said laser bar; and
controlling said first and second forces such that their relative horizontal and vertical components are applied.

4. A method for removing a laser bar from a channel of a coating device, said method comprising the steps of:
moving a roller device into said channel; and
applying said roller device only to opposite ends of said laser bar with approximately equal force.

* * * * *